United States Patent
Wang et al.

(10) Patent No.: US 8,786,319 B1
(45) Date of Patent: Jul. 22, 2014

(54) LATCH ISOLATION CIRCUIT

(75) Inventors: Dong Wang, San Francisco, CA (US); Tarun Gupta, Santa Clara, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 90 days.

(21) Appl. No.: 13/422,755

(22) Filed: Mar. 16, 2012

(51) Int. Cl.
*G11C 27/02* (2006.01)

(52) U.S. Cl.
USPC .............................. 327/94; 327/97; 327/217

(58) Field of Classification Search
USPC ........... 327/91, 93, 94, 96, 97, 124, 199, 215, 327/217, 218; 341/155
See application file for complete search history.

(56) References Cited

U.S. PATENT DOCUMENTS

| | | | |
|---|---|---|---|
| 5,546,028 A * | 8/1996 | Yamaguchi | 327/91 |
| 7,301,382 B2 * | 11/2007 | Osame et al. | 327/218 |
| 8,212,600 B2 * | 7/2012 | Osame et al. | 327/218 |

* cited by examiner

*Primary Examiner* — Long Nguyen
(74) *Attorney, Agent, or Firm* — Amin, Turocy & Watson, LLP (57) ABSTRACT

A system and method have been provided for passively isolating a latch circuit. The method provides a latch having a first input, an output, and a reset port. The latch first input is selectively connected to a first reference voltage. While the latch first input is connected to the first reference voltage, the latch is reset. Subsequent to disconnecting the latch first input from the first reference voltage, a first node is selectively connecting to the latch first input. In response to selectively connecting the first node, a first analog signal is supplied to the latch first input. Subsequent to resetting the latch, the first analog signal is captured and the latch output supplies a digital signal responsive to the captured first analog signal.

15 Claims, 6 Drawing Sheets

LATCH ISOLATION CIRCUIT

BACKGROUND OF THE INVENTION

1. Field of the Invention

This invention generally relates to electronic circuits and, more particularly, to a latch isolation system using passive component switches.

2. Description of the Related Art

As noted in Wikipedia, a flip-flop or latch is a circuit that has two stable states and can be used to store state information. The circuit can be made to change state by signals applied to one or more control inputs and has one or two outputs. It is the basic storage element in sequential logic. Flip-flops and latches are a fundamental building block of digital electronics systems used in computers, communications, and many other types of systems.

Flip-flops and latches are used as data storage elements. Such data storage can be used for storage of state, and such a circuit is described as sequential logic. When used in a finite-state machine, the output and next state depend not only on its current input, but also on its current state (and hence, previous inputs). It can also be used for counting of pulses, and for synchronizing variably-timed input signals to some reference timing signal. Flip-flops can be either simple (transparent or opaque) or clocked (synchronous or edge-triggered).

Figure 1:
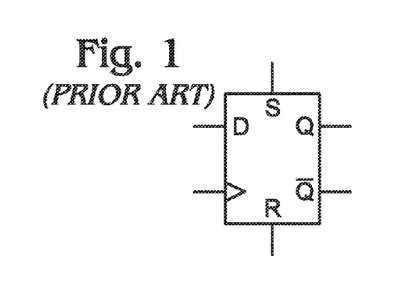
FIG. 1 is a schematic diagram of a D flip-flop (prior art).

FIG. 1 is a schematic diagram of a D flip-flop (prior art). There are a number of latch types known in the art. One widely used device is the D flip-flop. The D flip-flop captures the value of the D-input at a definite portion of the clock cycle (such as the falling edge of the clock). That captured value becomes the Q output. At other times, the output Q does not change.

Figure 2A:
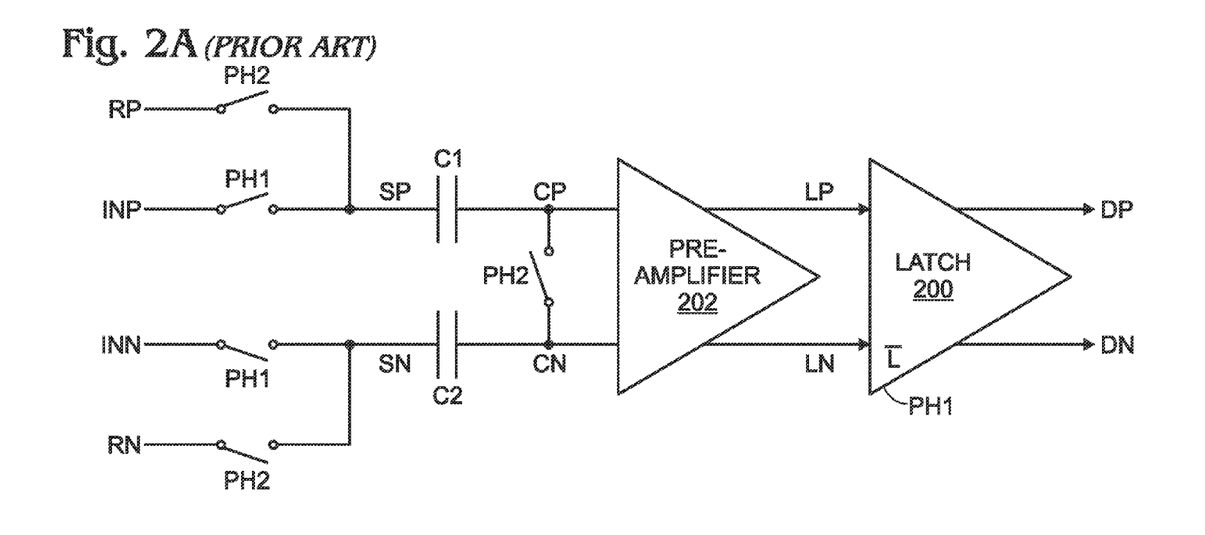
FIG. 2A is a schematic diagram depicting a conventional latch circuit (prior art).

FIG. 2A is a schematic diagram depicting a conventional latch circuit (prior art). The differential inputs (INP, INN) are sampled after subtracting the reference voltages (RP, RN) from their respective inputs. The result of the subtraction (CP, CN) is fed to the differential latch input (LP, LN). A pre-amplifier 202 is used to reduce offset and to isolate the latch 200, and prevent the latch from feeding signals back into the input nodes (INP, INN).

Figure 2B:
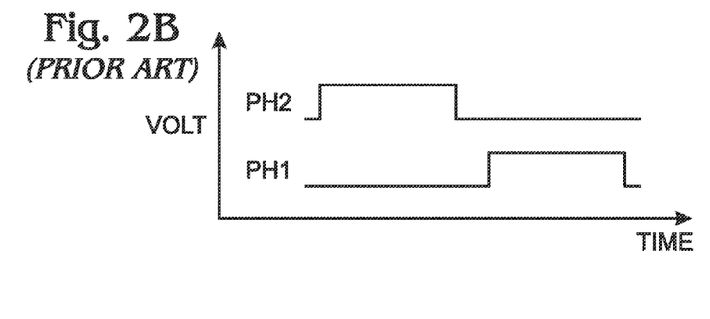
FIG. 2B is a plot depicting two non-overlapping clock phases, PH2 and PH1 associated with circuit of FIG. 2B (prior art).

FIG. 2B is a plot depicting two non-overlapping clock phases, PH2 and PH1 associated with the circuit of FIG. 2B (prior art). The timing relationship between the two phases is shown. During PH2, the reference voltage is sampled onto the capacitors C1 and C2. During PH1, input voltage is connected to SP and SN. Also during PH1, the difference between the input (INP, INN) and the reference (RP, RN) appears at the pre-amplifier input (CP, CN). The pre-amplifier then buffers its input and feeds it to the latch (LP, LN). At the end of the PH1 pulse, the latch is activated and generates a digital signal (DP, DN) to represent the latch input (LP, LN). While the circuit of FIG. 2A provides latch isolation, the use of a pre-amplifier is costly in terms of space and power usage.

It would be advantageous if a latch could be adequately isolated without the use of a pre-amplifier.

SUMMARY OF THE INVENTION

Disclosed herein are a system and method using a passive network of switches to sample and hold an analog input before feeding it to a latch or comparator. As noted above, the analog input voltage to a latch or comparator is conventionally fed through a pre-amplifier stage before it is handed over to the latch or comparator. The pre-amplifier reduces input offsets and reduces kick-back from the latch. The sampling network eliminates the need for a pre-amplifier therefore reducing area, power, and complexity of the latch or comparator without sacrificing performance.

Accordingly, a method is provided for passively isolating a latch circuit. The method provides a latch having a first input, an output, and a reset port. The latch first input is selectively connected to a first reference voltage. While the latch first input is connected to the first reference voltage, the latch is reset. Subsequent to disconnecting the latch first input from the first reference voltage, a first node is selectively connecting to the latch first input. In response to selectively connecting the first node, a first analog signal is supplied to the latch first input. Subsequent to resetting the latch, the first analog signal is captured and the latch output supplies a digital signal responsive to the captured first analog signal.

More explicitly, the latch first input is selectively connected to the first reference voltage in response to a first edge of a periodic reset pulse (RST). The latch is reset in response to a first edge of a periodic first clock (PH1) received at the latch reset port. The first node is selectively connected to the latch first input as follows. The latch first input is disconnected from the first reference voltage in response to the second edge of RST. Then, the first node is connected to the latch first input in response to a first edge of a periodic second clock (PH2). Prior to receiving the second edge of PH2, the second edge of PH1 is received, and the first analog signal is captured on the second edge of PH1.

Additional details of the above-described method, and a latch and isolation circuit are provided below.

DETAILED DESCRIPTION

Figure 3:
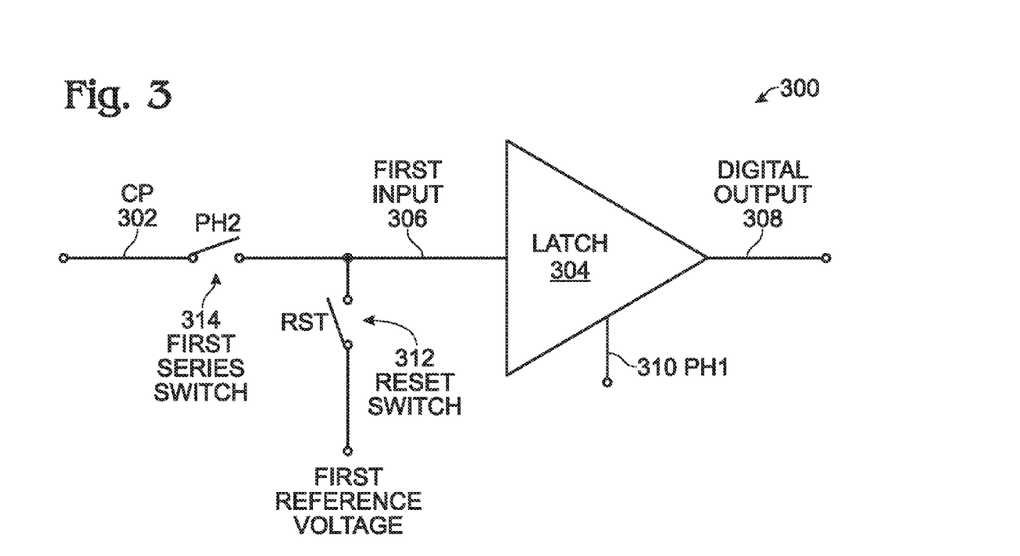
FIG. 3 is a schematic block diagram of a latch and isolation circuit.

FIG. 3 is a schematic block diagram of a latch and isolation circuit. The circuit 300 comprises a first node (CP) 302 to supply a first analog signal. A latch 304 has a first input on line 306 to receive the first analog signal, an output on line 308 to supply a digital signal responsive to the first analog signal, and a reset port on line 310. The latch 304 resets in response to a first edge of a periodic first clock (PH1) and captures the first analog signal on a second edge of PH1. A reset switch 312 is configured to selectively connect the latch first input on line 306 to a first reference voltage in response to a periodic reset pulse (RST). A first series switch 314 is configured to selectively connect the first node 302 to the latch first input on line 306 in response to a periodic second clock (PH2).

Figure 4:
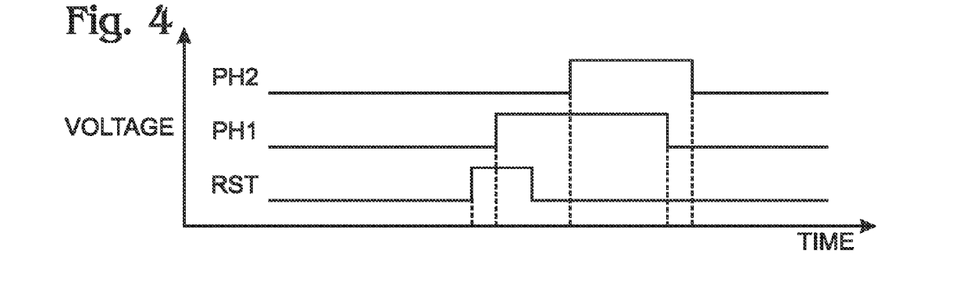
FIG. 4 is a timing diagram associated with the latch and isolation circuit of FIG. 3.

FIG. 4 is a timing diagram associated with the latch and isolation circuit of FIG. 3. The first edge of the PH1 occurs subsequent to a first edge of RST, but prior to a second edge of RST. The first edge of PH2 occurs subsequent to the first edge of PH1, and the second edge of PH2 occurs subsequent to the second edge of PH1. Note: the RST, PH1, and PH2 signals are described as periodic based upon the assumption that the analog input signals are also periodic. If the analog input is not periodic, the RST, PH1, and PH2 signals are asynchronously triggered in response to the analog input signal. In this example, the first edge of the RST, PH1, and PH2 signals are positive-going and the second edges are negative-going. However, the switching can be enabled using different signal edge polarities than the ones shown.

Figure 5:
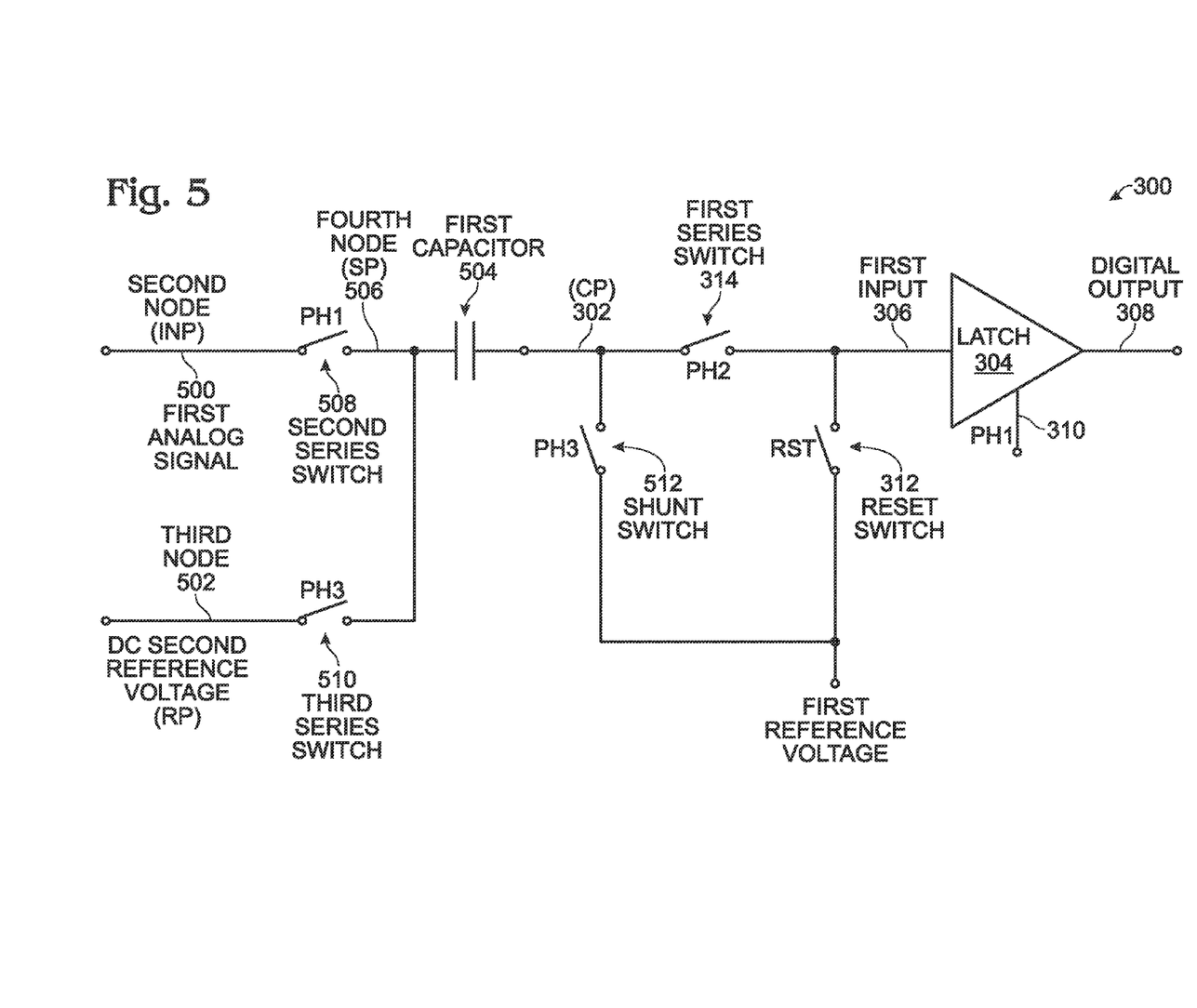
FIG. 5 is a schematic block diagram depicting a variation to the latch and isolation circuit of FIG. 3.

FIG. 5 is a schematic block diagram depicting a variation to the latch and isolation circuit of FIG. 3. In contrast to the single-ended design of FIG. 3, the latch and isolation circuit of FIG. 5 is a differential signal design. A second node 500 initially accepts the first analog signal. A third node 502 accepts a dc second reference voltage. A first capacitor 504 has a first terminal connected to a fourth node 506 (SP), and second terminal connected to the first node 302. A second series switch 508 is configured to selectively connect the second node 500 to the fourth node 506 in response to the first edge of first clock (PH1). A third series switch 510 is configured to selectively connect the third node 502 to the fourth node 506 in response to a first edge of a periodic third clock (PH3). A shunt switch 512 is configured to selectively connect the first node on line 302 to the first reference voltage in response to the first edge of the third clock PH3.

Figure 6:
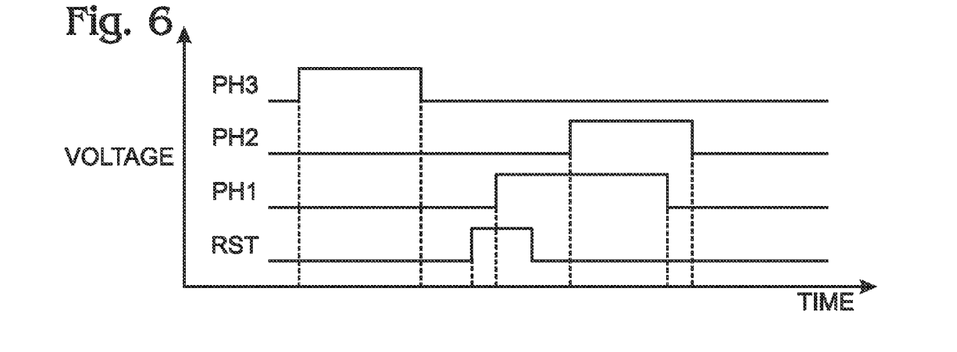
FIG. 6 is a timing diagram associated with the latch and isolation circuit of FIG. 5.

FIG. 6 is a timing diagram associated with the latch and isolation circuit of FIG. 5. The first edge of the PH1 occurs subsequent to a first edge of RST, but prior to a second edge of RST. The first edge of PH2 occurs subsequent to the first edge of PH1, and the second edge of PH2 occurs subsequent to the second edge of PH1. The first and second edges of the third clock (PH3) both occur prior to the first edge of RST.

Figures 7, 8:
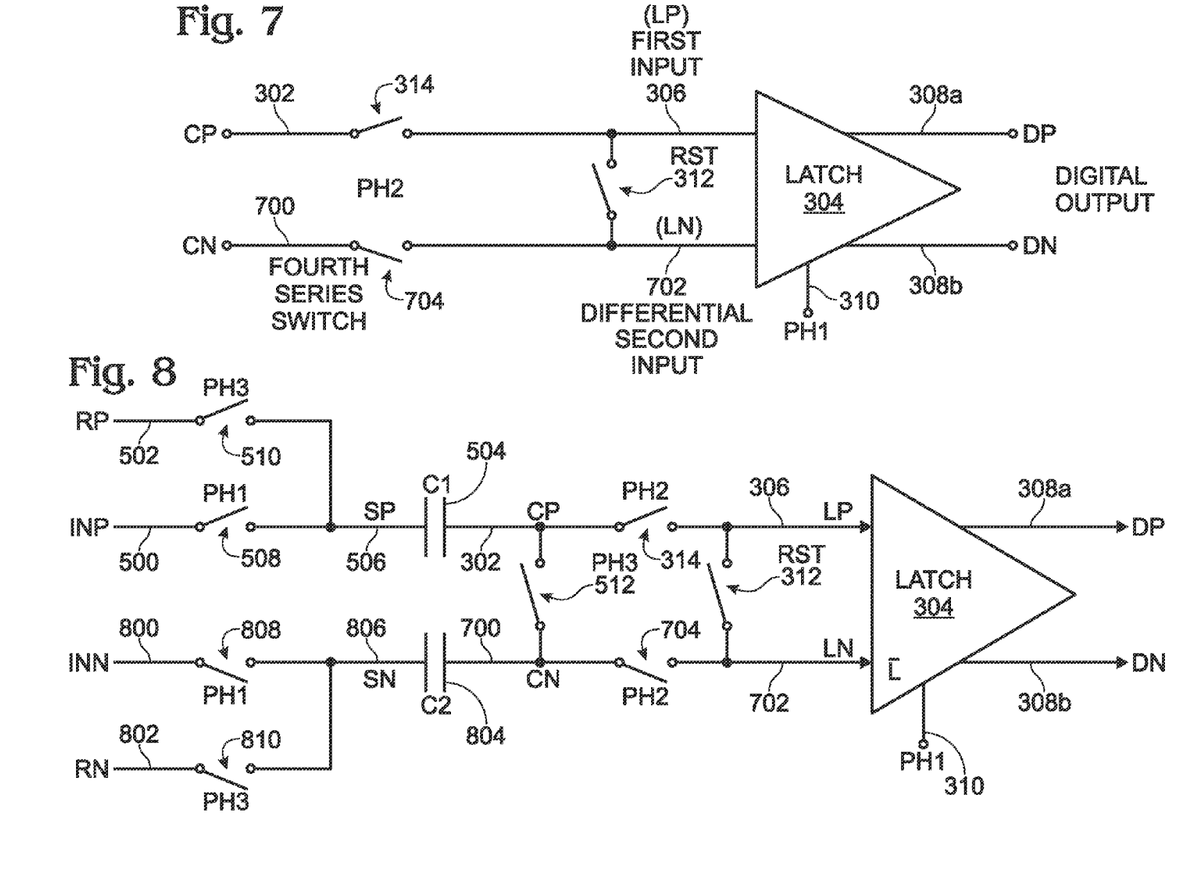
FIG. 7 is a schematic block diagram depicting a second variation of the latch and isolation circuit of FIG. 3.
FIG. 8 is a schematic block diagram depicting a third variation of the isolation and latch circuit of FIG. 3.

FIG. 7 is a schematic block diagram depicting a second variation of the latch and isolation circuit of FIG. 3. A fifth node (CN) 700 supplies a second analog signal, differential with respect to the first analog signal on line 302. The latch 304 has a differential second input on line 702 to accept the second analog signal, and the output on lines 308a and 308b supplies a differential digital signal. The reset switch 312 is configured to selectively connect the latch first and second inputs. The differential second analog signal functions as the first reference voltage with respect the first analog input signal. A fourth series switch 704 is configured to selectively connect the fifth node 700 (CN) to the latch second input on line 702 in response to the first edge of the second clock PH2. See the timing diagram of FIG. 4. Note: although device 304 has been described herein as a latch, the circuit of FIG. 7 also has application to the isolation of comparators.

FIG. 8 is a schematic block diagram depicting a third variation of the isolation and latch circuit of FIG. 3. As in FIG. 5, the second node 500 (INP) initially accepts the first analog signal and the third node 502 (RP) accept the dc second reference voltage. The first capacitor 504 has a first terminal connected to the fourth node 506, and second terminal connected to the first node 302. A second series switch 508 is configured to selectively connect the second node 500 (INP) to the fourth node 506 (SP) in response to the first edge of the first clock (PH1). The third series switch 510 is configured to selectively connect the third node 502 (RP) to the fourth node 506 (SP) in response to a first edge of a periodic third clock (PH3). A shunt switch 512 is configured to selectively connect the first node 302 (CP) to the fifth node 700 (CN) in response to the first edge of the third clock PH3.

In addition, the circuit of FIG. 8 includes a sixth node 800 (INN) that initially accepts the second analog signal. A seventh node 802 (RN) accepts a dc second differential reference voltage. A second capacitor 804 has a first terminal connected to an eighth node 806 (SN), and second terminal connected to the fifth node 700 (CN). A fifth series switch 808 is configured to selectively connect the sixth node 800 (INN) to the eighth node 806 (SN) in response to the first edge of the first clock (PH1). A sixth series switch 810 is configured to selectively connect the seventh node 802 (RN) to the eighth node 806 (SN) in response to the first edge of the third clock (PH3). The first and second edges of the third clock (PH3) both occur prior to the first edge of RST, see the timing diagram of FIG. 6.

Note: the circuits depicted in FIGS. 3 and 7 are configured to accept either ac analog, or dc analog signals. The circuits of FIGS. 5 and 8 are configured to accept ac analog signals, but could also be adapted to receive dc analog signals by removing the capacitors.

Functional Description

The above-described isolation circuits eliminate the pre-amplifier shown in FIG. 2A. As compared to the conventional pre-amplifier approach, the circuit of FIG. 8 adds three additional switches and two extra clock phases to isolate the latch inputs (LP, LN) from the inputs (INP, INN). Similar to the conventional pre-amplifier approach, two non-overlapping clock phases PH1 and PH3 are used to sample the inputs and subtract the respective references, to obtain the voltages seen at nodes CP and CN.

The clock phase PH2 is used to isolate CP and CN from LP and LN, respectively, when the latch starts reset. In addition, the clock phase RST is used to short the latch inputs (LP, LN) together while the latch is being reset.

Among other uses, such an isolation circuit has application in the analog front end (AFE) of a 100G-BaseT transceiver. The receive path contains an analog-to-digital converter (ADC) that is used to convert analog signals on twisted-pair wires to logic 0s and 1s and it is a key building block of any transceiver. A comparator or latch is a fundamental building block used in the ADC.

Figure 9A:
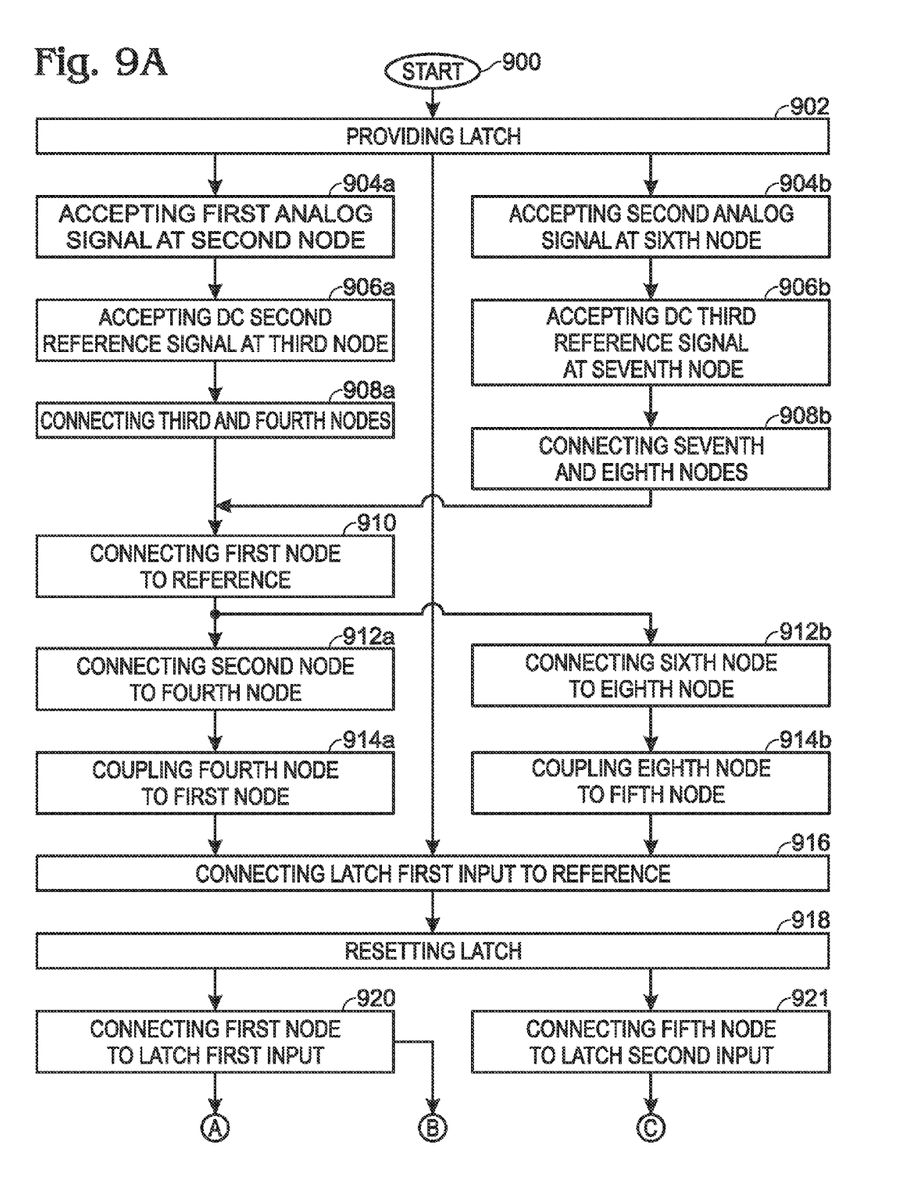
FIGS. 9A and 9B are flowcharts illustrating a method for passively isolating a latch circuit.
Figure 9B:
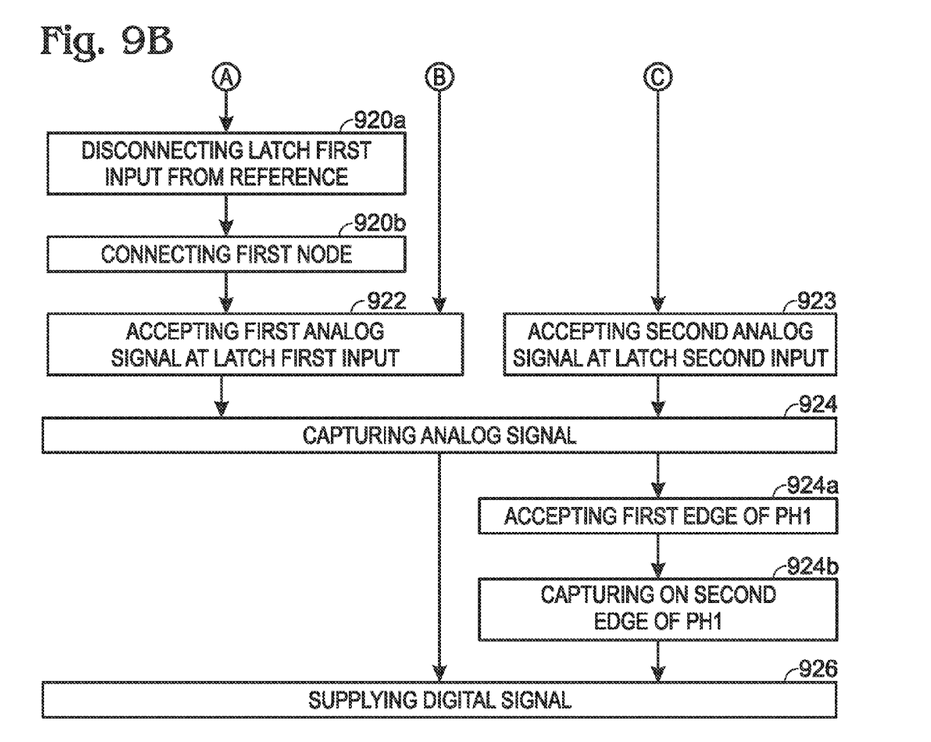

FIGS. 9A and 9B are flowcharts illustrating a method for passively isolating a latch circuit. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 900.

Step 902 provides a latch having a first input, an output, and a reset port. Step 916 selectively connects the latch first input to a first reference voltage. While the latch first input is connected to the first reference voltage, Step 918 resets the latch. Subsequent to disconnecting the latch first input from the first reference voltage, Step 920 selectively connects a first node (CP) to the latch first input. In response to selectively connecting the first node (CP), Step 922 supplies a first analog signal to the latch first input. The first analog signal may be either an ac or dc signal. Subsequent to resetting the latch, Step 924 captures the first analog signal. In Step 926 the latch output supplies a digital signal responsive to the captured first analog signal. Selectively connecting the latch first input to a first reference voltage is Step 916, and selectively connecting the first node (CP) to the latch first input in Step 920 may include using passive switches to enable the selective connections. Alternatively, active transistor circuitry may be used as the switches.

In one aspect, selectively connecting the latch first input to the first reference voltage in Step 916 includes selectively connecting in response to a first edge of a periodic reset pulse (RST). Resetting the latch in Step 918 includes resetting the latch in response to a first edge of a periodic first clock (PH1) received at the latch reset port. The PH1 first edge occurs after the first edge of RST, but before the second edge of RST. Connecting the first node (CP) to the latch first input in Step 920 may include substeps. Step 920*a* disconnects the latch first input from the first reference voltage in response to a second edge of RST. Step 920*b* connects the first node (CP) to the latch first input in response to a first edge of a periodic second clock (PH2), which occurs after the second edge of RST. Capturing the first analog signal in Step 924 may also include substeps. Prior to supplying a second edge of PH2, Step 924*a* accepts a second edge of PH1. Step 924*b* captures the first analog signal on the second edge of PH1.

In one aspect, in Step 904*a* a second node (INP) initially accepts the first analog signal. In Step 906*a* a third node (RP) accepts a dc second reference voltage. Step 908*a* selectively connects the third node (RP) to a fourth node (SP) in response to the first edge of the third clock (PH3). Simultaneously with Step 908*a*, Step 910 selectively connects the first node (CP) to the first reference voltage. Then, the third node (RP) is disconnected from the fourth node (SP), and the first node (CP) from the first reference voltage prior to connecting the first node (CP) to the latch first input. That is, Step 910 accepts a second edge of the third clock (PH3) prior to the first edge of RST. Step 912*a* selectively connects the second node (INP) to the fourth node (SP) in response to the first edge of PH1, which occurs before the second edge of RST. Step 914*a* capacitively couples the fourth node (SP) to the first node (CP). In another aspect, Step 902 provides a latch with a differential second input to accept a second analog signal, differential to the first analog signal. As defined herein, the second analog signals acts as the first reference voltage with respect to the first analog voltage. Then, selectively connecting the latch first input to a first reference voltage in Step 916 includes selectively connecting the latch first input to the latch second input. Subsequent to disconnecting the latch first input from the latch second input in Step 916, Step 921 selectively connects a fifth node (CN) to the latch second input (LN) in response to the first edge of second clock (PH2). In response to selectively connecting the fifth node (CN), Step 923 accepts the second analog signal, differential to the first analog signal, to the latch second input. Then, supplying the digital signal in Step 926 includes supplying a differential digital signal responsive to captured first and second analog signals.

In one aspect, in Step 904*b* a sixth node (INN) initially accepts the second analog signal. In Step 906*b* a seventh node (RN) accepts a dc third reference voltage. Step 908*b*, simultaneously with the connection of the third node to the fourth node, selectively connects the seventh node (RN) to an eighth node (SN) in response to the first edge of the third clock (PH3). Step 912*b*, simultaneously with the connection of the second node to the fourth node, selectively connects the sixth node (INN) to the eighth node (SN) in response to the first edge of the first clock (PH1). Step 914*b* capacitively couples the eighth node (SN) to the fifth node (CN).

A system and method have been provided for latch isolation. Examples of single-ended and differential latches have been presented to illustrate the invention. However, the invention has broader application to any single-ended or dual input device that can benefit from isolation. Other variations and embodiments of the invention will occur to those skilled in the art.

We claim:

1. A latch isolation circuit comprising:
   a first node (CP) to supply a first analog signal;
   a latch having a first input (LP) to receive the first analog signal, an output to supply a digital signal responsive to the first analog signal, and a reset port, wherein the latch resets in response to a first edge of a periodic first clock (PH1) and captures the first analog signal on a second edge of PH1;
   a reset switch configured to selectively connect the latch first input to a first reference voltage in response to a periodic reset pulse (RST);
   a first series switch configured to selectively connect the first node (CP) to the latch first input (LP) in response to a periodic second clock (PH2);
   wherein the first edge of the PH1 occurs subsequent to a first edge of RST, but prior to a second edge of RST; and
   a first edge of PH2 occurs subsequent to the first edge of PH1 and a second edge of PH2 occurs subsequent to the second edge of PH1.

2. The latch isolation circuit of claim 1 further comprising:
   a second node (INP) to initially accept the first analog signal;
   a third node (RP) to accept a dc second reference voltage;
   a first capacitor having a first terminal connected to a fourth node (SP), and second terminal connected to the first node (CP);
   a second series switch configured to selectively connect the second node (INP) to the fourth node (SP) in response to the first edge of first clock (PH1);
   a third series switch configured to selectively connect the third node (RP) to the fourth node (SP) in response to a first edge of a periodic third clock (PH3);
   a shunt switch configured to selectively connect the first node (CP) to the first reference voltage in response to the first edge of the third clock PH3; and
   wherein a first and second edges of the third clock (PH3) both occur prior to the first edge of RST.

3. The latch isolation circuit of claim 1 further comprising:
   a fifth node (CN) to supply a second analog signal, differential with respect to the first analog signal;
   wherein the latch has a differential second input (LN) to accept the second analog signal, and the output supplies a differential digital signal (DP and DN);
   the reset switch is configured to selectively connect the latch first input (LP) and latch second input (LN); and
   the latch isolation circuit further comprising:
   a fourth series switch configured to selectively connect the fifth node (CN) to the latch second input (LN) in response to the first edge of the second clock PH2.

4. The latch isolation circuit of claim 3 further comprising:
   a second node (INP) to initially accept the first analog signal;
   a third node (RP) to accept a dc second reference voltage;
   a first capacitor having a first terminal connected to a fourth node (SP), and second terminal connected to the first node (CP);
   a second series switch configured to selectively connect the second node (INP) to the fourth node (SP) in response to the first edge of the first clock (PH1);
   a third series switch configured to selectively connect the third node (RP) to the fourth node (SP) in response to a first edge of a periodic third clock (PH3);

a sixth node (INN) to initially accept the second analog signal;
a seventh node (RN) to accept a dc second differential reference voltage;
a second capacitor having a first terminal connected to an eighth node (SN), and second terminal connected to the fifth node (CN);
a fifth series switch configured to selectively connect the sixth node (INN) to the eighth node (SN) in response to the first edge of the first clock (PH1);
a sixth series switch configured to selectively connect the seventh node (RN) to the eighth node (SN) in response to the first edge of the third clock (PH3); and
a shunt switch configured to selectively connect the first node (CP) to the fifth node (CN) in response to the first edge of the third clock PH3;
wherein a first and second edges of the third clock both occur prior to the first edge of RST.

5. The latch isolation circuit of claim 1 wherein the first node (CP) supplies the first analog signal comprising an ac analog signal or a dc analog signal.

6. A method for passively isolating a latch isolation circuit, comprising:
providing a latch having a first input (LP), an output (DP), and a reset port;
selectively connecting the latch first input (LP) to a first reference voltage;
while the latch first input is connected to the first reference voltage, resetting the latch;
subsequent to disconnecting the latch first input from the first reference voltage, selectively connecting a first node (CP) to the latch first input (LP);
in response to selectively connecting the first node (CP), accepting a first analog signal at the latch first input (LP);
subsequent to resetting the latch, capturing the first analog signal; and
the latch output (DP) supplying a digital signal responsive to the captured first analog signal.

7. The method of claim 6 wherein selectively connecting the latch first input (LP) to the first reference voltage comprises selectively connecting in response to a first edge of a periodic reset pulse (RST);
resetting the latch includes resetting the latch in response to a first edge of a periodic first clock (PH1) received at the latch reset port, the first edge of PH1 occurring after the first edge of RST and before the second edge of RST;
selectively connecting the first node (CP) to the latch first input (LP) comprises:
disconnecting the latch first input (LP) from the first reference voltage in response to a second edge of RST; and
connecting the first node (CP) to the latch first input (LP) in response to a first edge of a periodic second clock (PH2), which occurs after the second edge of RST;
wherein capturing the first analog signal comprises:
prior to supplying a second edge of PH2, accepting a second edge of PH1; and
capturing the first analog signal on the second edge of PH1.

8. The method of claim 7 further comprising:
a second node (INP) initially accepting the first analog signal;
a third node (RP) accepting a dc second reference voltage;
selectively connecting the third node (RP) to the fourth node (SP);
simultaneously with connecting the third node (RP) to the fourth node (SP), selectively connecting the first node (CP) to the first reference voltage;
subsequent to disconnecting the third node (RP) from the fourth node (SP) and the first node (CP) from the first reference voltage, and prior to connecting the first node (CP) to the latch first input (LP), selectively connecting the second node (INP) to a fourth node (SP); and,
capacitively coupling the fourth node (SP) to the first node (CP).

9. The method of claim 8 wherein selectively connecting the third node (RP) to the fourth node (SP), and selectively connecting the first node (CP) to the first reference voltage comprises:
connecting in response to the first edge of the third clock PH3;
disconnecting by accepting a second edge of the third clock (PH3) prior to the first edge of RST; and
wherein selectively connecting the second node (INP) to the fourth node (SP) comprises connecting in response to the first edge of PH1, occurring before the second edge of RST.

10. The method of claim 7 wherein providing the latch comprises providing a latch with a differential second input (LN) to accept a second analog signal, differential to the first analog signal; and
selectively connecting the latch first input (LP) to a first reference voltage comprises selectively connecting the latch first input (LP) to the latch second input (LN);
the method further comprising:
subsequent to disconnecting the latch first input (LP) from the latch second input (LN), selectively connecting a fifth node (CN) to the latch second input (LN); and
in response to selectively connecting the fifth node (CN), accepting a second analog signal, differential to the first analog signal, at the latch second input (LN);
wherein supplying the digital signal comprises supplying a differential digital signal (DP and DN) responsive to a captured first and second analog signals.

11. The method of claim 10 wherein selectively connecting the fifth node (CN) to the latch second input (LN) comprises connecting in response to the first edge of the second clock (PH2).

12. The method of claim 10 further comprising:
a second node (INP) initially accepting the first analog signal;
a third node (RP) accepting a dc second reference voltage;
selectively connecting the third node (RP) to the fourth node (SP);
simultaneously with connecting the third node (RP) to the fourth node (SP), selectively connecting the first node (CP) to the fifth node (CN);
subsequent to disconnecting the third node (RP) from the fourth node (SP) and the first node (CP) from the fifth node (CN), and prior to connecting the first node (CP) to the latch first input (LP), selectively connecting the second node (INP) to a fourth node (SP); and,
capacitively coupling the fourth node (SP) to the first node (CP);
a sixth node (INN) initially accepting the second analog signal;
a seventh node (RN) accepting a dc third reference voltage;
simultaneously with the connection of the third node (RP) to the fourth node (SP), selectively connecting the seventh node (RN) to the eighth node (SN);

simultaneously with the connection of the second node (INP) to the fourth node (SP), selectively connecting the sixth node (INN) to the eighth node (SN); and, capacitively coupling the eighth node (SN) to the fifth node (CN).

13. The method of claim 12 wherein selectively connecting the second node (INP) to the fourth node (SP), and the first node (CP) to the fifth node (CN) comprises connecting in response to the first edge of the third clock PH3;

selectively connecting the second node (INP) to a fourth node (SP) comprises connecting in response to the first edge of the first clock (PH1); and wherein disconnecting the latch first input from the latch second input (LN) in response to a second edge of RST comprises accepting a second edge of the third clock (PH3) prior to the first edge of RST.

14. The method of claim 6 wherein accepting the first analog signal at the latch first input (LP) comprises supplying a first analog signal comprising an ac analog signal or a dc analog signal.

15. The method of claim 6 wherein selectively connecting the latch first input (LP) to a first reference voltage, and selectively connecting the first node (CP) to the latch first input (LP) comprises using components comprising passive switches or transistors to enable the selective connections.

* * * * *